ANALOG-TO-DIGITAL CONVERTER
Filed Oct. 27, 1960 3 Sheets-Sheet 1
FIG. 1 OPERATIONAL AMPLIFIER, FIG. 2 COMPARATOR LOGIC
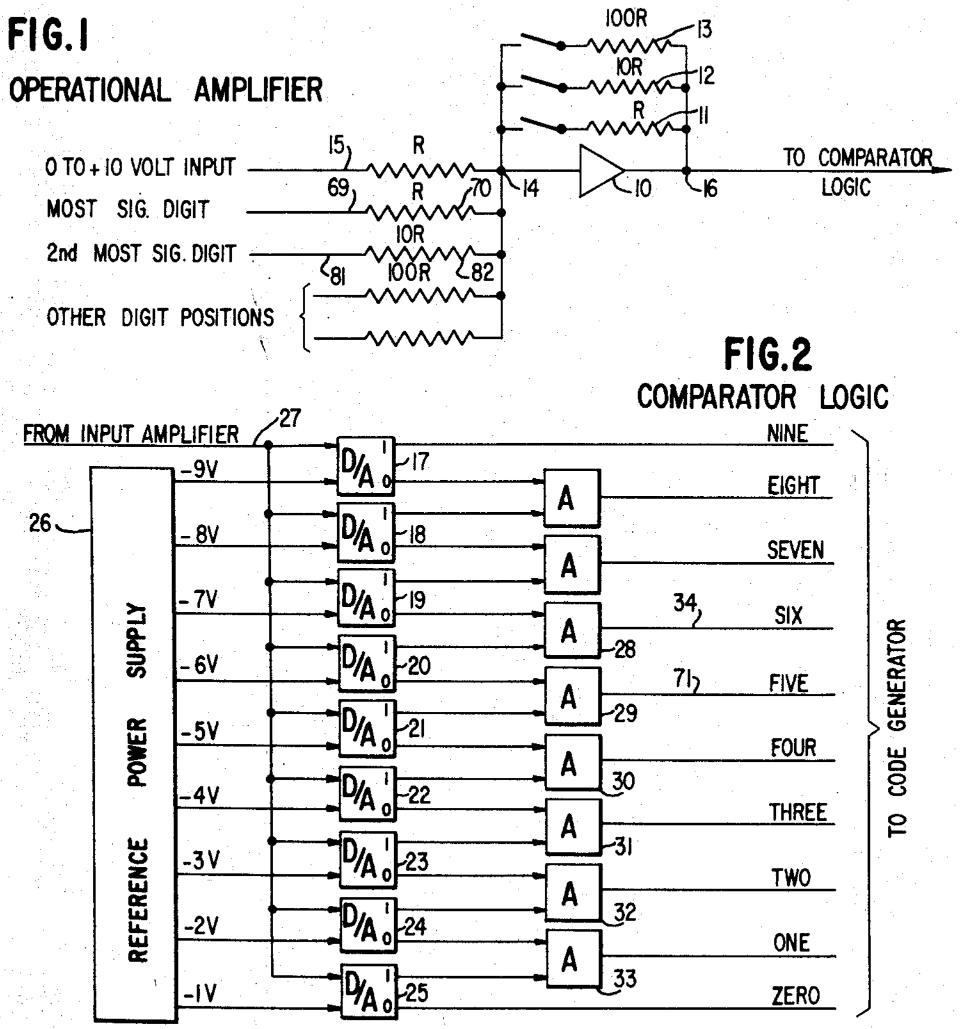
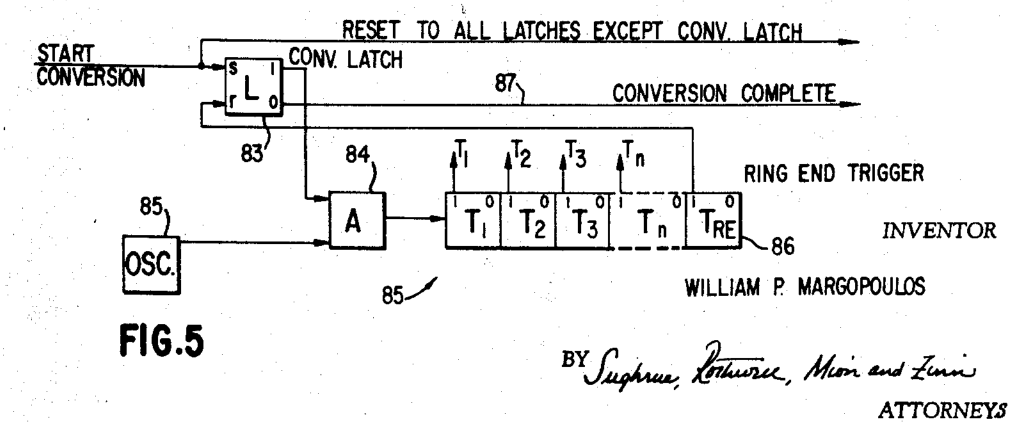
FIG. 5
INVENTOR
WILLIAM P. MARGOPOULOS
BY Sughrue, Rothwell, Mion and Zinn
ATTORNEYS

CODE GENERATOR AND REGISTER

Jan. 8, 1963 W. P. MARGOPOULOS 3,072,332
ANALOG-TO-DIGITAL CONVERTER
Filed Oct. 27, 1960 3 Sheets-Sheet 3
FIG.4 MULTIPLEXER LOGIC
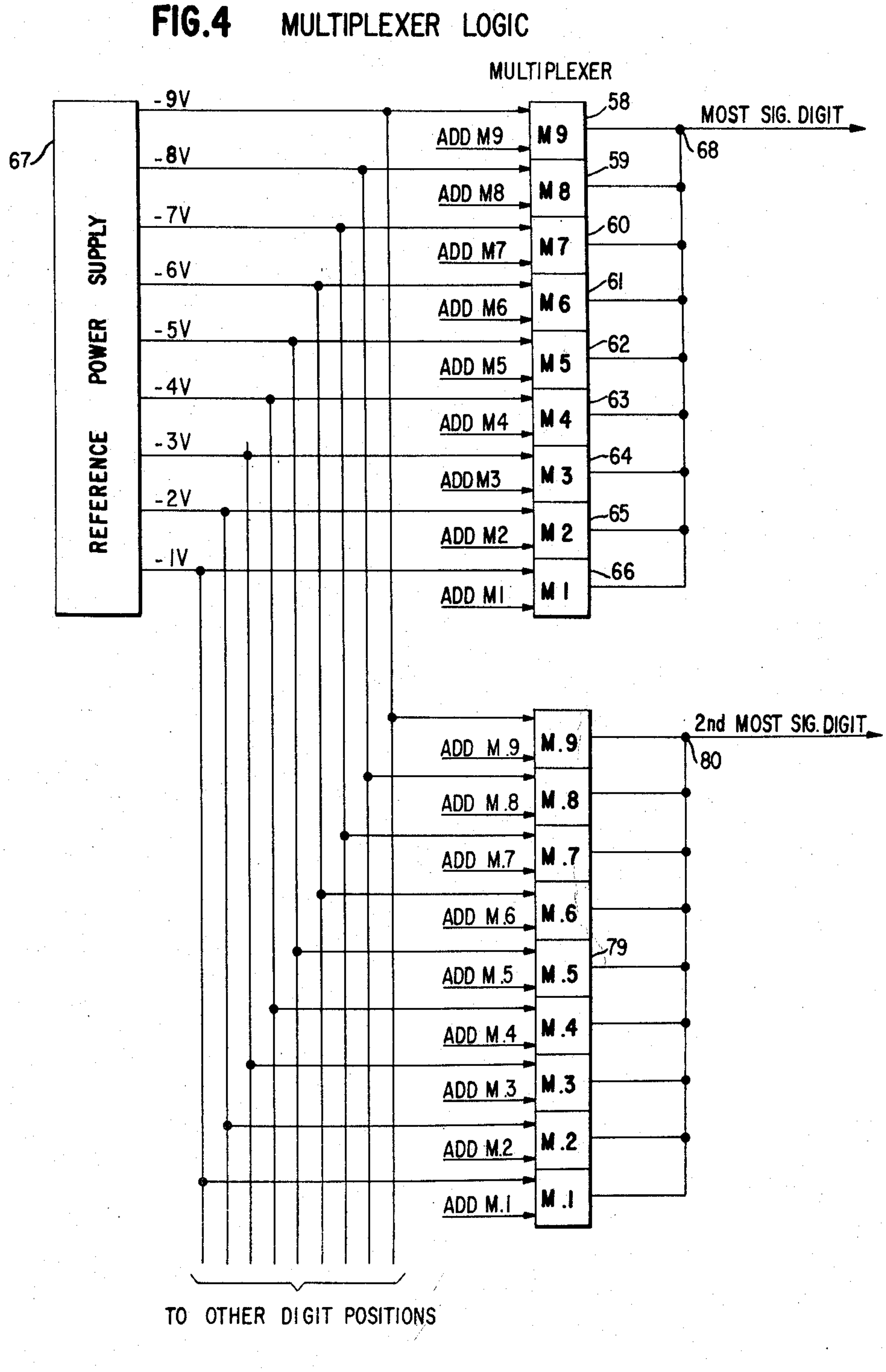

3,072,332
ANALOG-TO-DIGITAL CONVERTER

William P. Margopoulos, Poughkeepsie, N.Y., assignor to International Business Machines Corporation, New York, N.Y., a corporation of New York Filed Oct. 27, 1960, Ser. No. 65,456
5 Claims. (Cl. 235—154)

This invention relates to an analog-to-digital converter and more particularly to a converter which converts sequentially each order of a multidigit order or analog signal to a digital representation thereof and stores a separate digital representation of the magnitude of each of said orders.

In general, the converter of this invention relates to a system for converting an analog voltage to a digital representation thereof. It has the advantage of only a single decision time for each order of said analog voltage. The analog signal is fed to a variable gain amplifier having a preset gain which is a function of the particular order being converted. The output of the amplifier is fed to a decision network which determines the highest order value of the amplifier output. First means are provided responsive to this determination to store this highest order value in digital form and second means are provided which are responsive to said storage to subtract this highest order value from the analog signal present at the input to the amplifier. This sequence is repeated once for each order of the multiorder signal until each of the orders are converted to a digital representation.

It is therefore an object of this invention to provide an analog-to-digital converter which converts in sequence each order of the multiorder analog signal, from most to least significant, with but one decision time per order.

It is a further object of this invention to employ a variable gain amplifier for such conversion, said gain being a function of the order being converted.

It is still a further object of this invention to employ a variable gain amplifier in which there is provided means to increase the gain of the amplifier from one order conversion to the next by a factor which is equal to the radix of the digital representation of the analog signal.

These and other objects will become apparent from a more detailed description of the accompanying drawings.

In the drawings:

FIGURE 1 is a diagrammatic representation of one form of variable gain amplifier that may be employed in accordance with this invention;

FIGURE 2 is a diagrammatic representation of one form of comparator which may be used in accordance with this invention;

FIGURE 4 is a diagrammatic representation of one form of multiplexer which may be used in accordance with this invention; and FIGURE 5 is a diagrammatic representation of one form of a means for generating various signals employed in the converter of the present invention.

Figure 3:
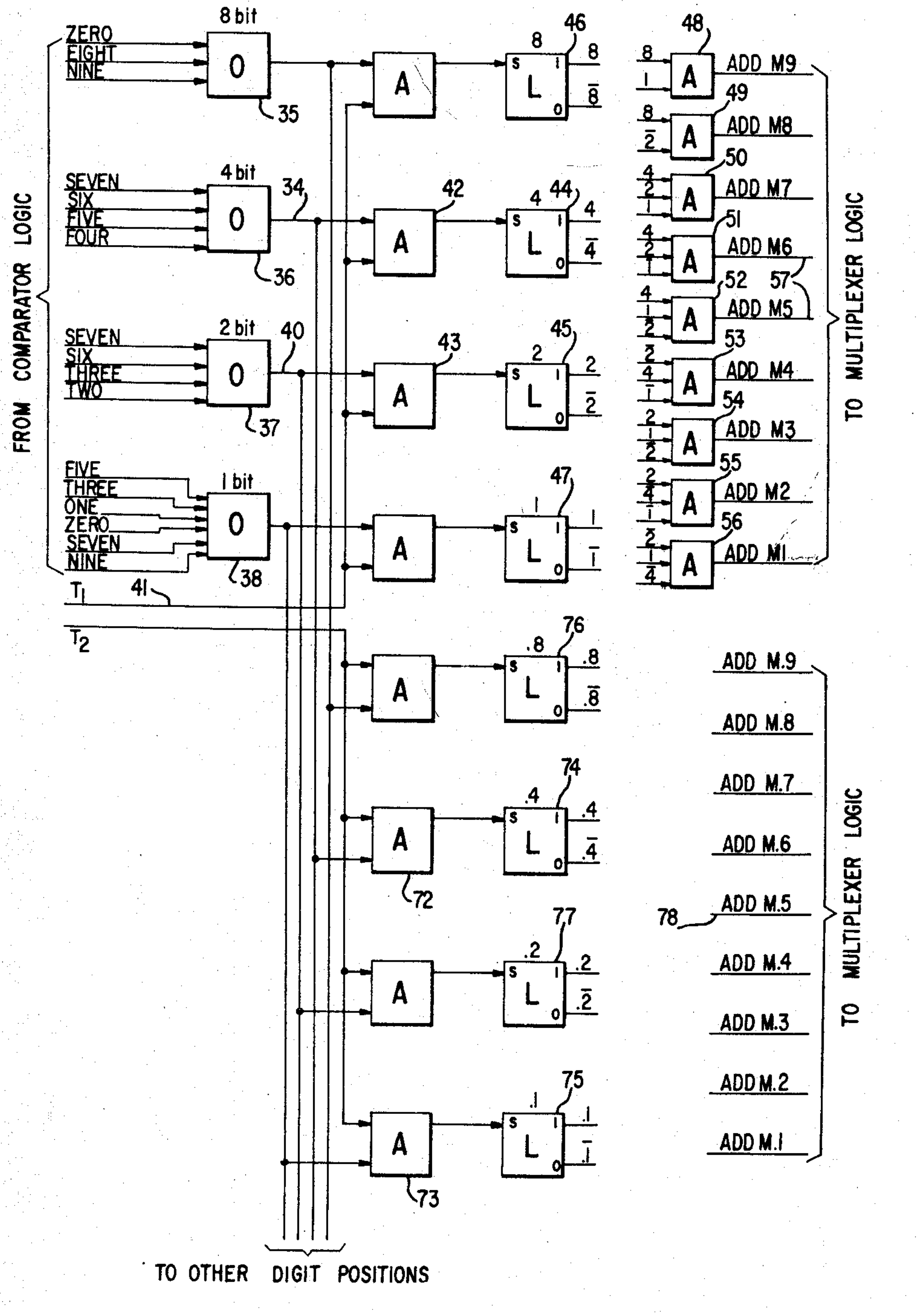
FIGURE 3 is a diagrammatic representation of one form of code generator and register which may be employed in accordance with this invention.

Referring first to FIGURE 1, there is shown an operational amplifier 10. This amplifier with its associated circuitry functions as a variable gain amplifier. Depending upon which one of the switches $S_1$, $S_2$ or $S_3$ are closed the gain of the amplifier may be respectively 1, 10 or 100. Resistor 11 has a value of R and when switch $S_1$ is closed, the gain of amplifier is 1. Resistor 12 has a value of 10R and when switch $S_2$ is closed, the gain of the amplifier is 10. Resistor 13 has a value of 100R and when switch $S_3$ is closed, the amplifier has a gain of 100. Consequently, the voltage at point 14 is amplified an amount depending upon which one of the above-identified three switches are in the closed position. It should be noted that these switches are shown as mechanical switches but this is for illustration purposes only. For present purposes any conventional electronic switch may be employed. To illustrate the operation of the system let us assume that the input to the input line 15 is +6.54 volts. With switch $S_1$ closed the output of amplifier 10 at point 16 will be −6.54 volts. The opening and closing of these switches will be illustrated at a later point. The 6.54 volts is fed to the comparator logic system as shown in FIGURE 2.

Now referring to FIGURE 2, there is shown a plurality of differential amplifiers 17 through 25, inclusive. The −6.54 volts from the variable gain amplifier of FIGURE 1 is fed to one side of each of these amplifiers. To the other side of the amplifiers is fed from the reference power supply 26 various analog voltages as shown differing by one volt. These amplifiers are normally in their "0" state. They will be switched to their "1" state provided the voltage on line 27 is higher than the reference voltage supplied thereto. Consequently, it can be seen in the present example that amplifiers 20 through 25 switch to their "1" state. The "1" lines of each go up to the respective AND gates 28 through 33, inclusive. However, it can be seen that only AND gate 28 has both of its inputs at an up level. This, of course, is because amplifier 19 is in the "0" state with the "0" line up and amplifier 20 is in the "1" state with its "1" line up. Consequently, the 6 line identified by numeral 34, goes up. All others remain down. The output from the comparator logic circuit is fed to the code generator and register shown in FIGURE 3.

Turning to FIGURE 3, the "0" to "9" lines from the comparator logic circuit are fed to the various OR gates identified as 35, 36, 37 and 38. These OR gates and the AND gates of FIGURE 2 function as switching means controlling the register of FIGURE 4. OR gate 35 is the "8" bit OR gate, OR gate 36 is the "4" bit OR gate, OR gate 37 is the "2" bit OR gate and OR gate 38 is the "1" bit OR gate. In the particular example under consideration the "6" line identified as 34 from FIGURE 2 is fed to OR gates 36 and 37. Consequently, lines 39 and 40 are up. The most significant digit timing pulse $T_1$ appears on line 41 at this time. Its generation will be discussed later. Consequently, only AND gates 42 and 43 are unblocked so that their outputs go up. These outputs are fed to the SET inputs to LATCHES 44 and 45 to place them in their SET or "1" states. Complementary outputs are provided from these two latches. LATCH 44 is the "4" latch and LATCH 45 is the "2" latch. Consequently, the "4" line of LATCH 44 is up and "2" line of LATCH 45 is up. The outputs of the four LATCHES, 44 through 47, are fed as indicated to the AND gates 48 through 56, inclusive. It can be seen in this particular case that only AND gate 51 is unblocked to provide an up level on the line add *m*6 indicated by the numeral 57. LATCHES 44 and 45 store a "6" which is the most significant digit of the input signal. The output from AND gate 51 on line 57 is fed to the multiplexer logic shown in FIGURE 4. RESET for these latches (not shown) is provided.

This multiplexer includes nine stages identified as 58 through 66, inclusive. To one input to each of these stages is fed from the reference power supply 67 a negative voltage varying in one volt steps from −9 volts to −1 volt. Each of these states in their simplest form may include a solenoid which is energized by any of the "add" lines ot connect one of the minus voltage levels to the output at point 68. In this particular case, the add *m*6 line 57 being up, connects the −6 volts at the input of the *m*6 stage to the output thereof to apply −6 volts to point 68. This again is the most significant digit of the input signal. It is fed back to FIGURE 1. It is applied on line 69 through resistor 70 having a value of R to the input of the amplifier 10. At this time the $T_2$ pulse is generated which results in the closing of switch $S_2$ and the opening of switch $S_1$. The gain of amplifier is now 10. The input voltage at point 14 is now .54 volts due to the algebraic sum of +6.54 and −6.0 volts. Consequently, the output voltage level at point 16 at the output of amplifier 10 is 5.4 volts. The 5.4 volts is again sent to line 27 in FIGURE 2 and results in the "5" line indicated at 71 going up. This "5" line is fed to OR gates 36 and 38 in FIGURE 3. The output of OR gate 36 is fed to AND gate 72 and the output of OR gate 38 is fed to AND gate 73. The $T_2$ pulse now unblocks these two AND gates to place LATCH 74 and LATCH 75 in their "1" states. The LATCHES 74 through 77 are the latches which store the second most significant digit of the input signal. As can be seen here a .5 is thus stored. AND gates provided similarly to AND gates 48 through 56 are connected to the outputs of the LATCHES 74 through 77. Consequently, the add *m*.5 line 78 goes up. This line is connected to the multiplexer of FIGURE 4 and particularly to the *m*.5 stage indicated at 79. This couples the −5 volts at the input thereof to point 80. Point 80 is connected back to FIGURE 1 and particularly to line 81. Through the dropping resistor 82 which has a value of 10R this subtracts .5 volts from the voltage at point 14. This now provides an input to amplifier 10 of .04 volts. The $T_3$ pulse closes switch $S_3$ and the gain of amplifier 10 is now 100. Consequently, the output at point 16 is 4 volts. By similar logic it can be seen that a number of significant positions of the input signal can be handled.

Now referring to FIGURE 5 there is shown the generation of the various timing pulses. A start conversion signal is applied to the conversion LATCH 83 which is normally in its "0" or RESET state. This switches this latch to its "1" state and its "1" output goes up to condition AND gate 84. The timing pulse oscillator 85 passes its first timing pulse through AND gate 84 to switch the first trigger $T_1$ of the ring 85 to its "1" state to provide the $T_1$ pulse. The start conversion pulse also resets all of the latches except, of course, the conversion latch. There are a number of stages in the ring equal to the number of significant positions which are to be converted. After the last significant position of the input signal has been converted, the ring end trigger stage 86 is switched to its "1" state to reset the conversion latch and provide a conversion complete signal on line 87.

While a binary coded decimal embodiment has been described, it is apparent that the invention is not so limited. The gain of the amplifier 10 is determined by the order being converted and the gain from one order to the next is increased by a factor equal to the radix of the digital representation. In this embodiment said factor is 10. Other embodiments obvious to those skilled in the art are contemplated to be within the spirit and scope of the accompanying claims.

What is claimed is:

1. An analog-to-digital converter for sequentially converting each order of a multidigit order analog signal to a digital representation thereof that comprises a variable gain amplifier for amplifying an input signal thereto, means to set the gain of said amplifier as determined by the order being converted, means to determine the highest order value of the output of said amplifier, means responsive to said determination to store said highest order value in digital form and means responsive to said storage to subtract said value from said analog signal to provide said input to said amplifier.

2. A converter as claimed in claim 1 wherein said means to determine the highest order value comprises a plurality of analog voltage sources, means to compare the output of said amplifier to said voltage sources, means responsive to an analog match between the highest order value of said output and one of said voltage sources to provide said determination.

3. A converter as claimed in claim 2 wherein said sources are nine in number differing by one volt from 1 volt to 9 volts.

4. A converter as claimed in claim 3 further including switching means associated with each source, a digital register under control of said switching means for each of said orders, means responsive to said match for energizing said associated switching means whereby said energized switching means cause said highest order value to be stored in said register in digital form.

5. An analog-to-digital converter for sequentially converting each order of a multidigit order analog signal to a digital representation thereof that comprises a variable gain amplifier for amplifying an input signal thereto, means to set the gain of said amplifier as determined by the order being converted, means to determine the highest order value of the output of said amplifier, means responsive to said determination to store said highest order value in digital form, means responsive to said storage to subtract said value from said analog signal to provide said input signal to said amplifier and means to increase the gain of said amplifier from one order conversion to the next by a factor equal to the radix of said digital representation.

References Cited in the file of this patent

UNITED STATES PATENTS 2,569,927 Gloess et al. ............ Oct. 2, 1951

OTHER REFERENCES

Hollander: Criteria For The Selection of Analog-To-Digital Converters, Proc. of the National Electronics Conference, for 1953, February 15, 1954.